(12) United States Patent
Hung et al.

(10) Patent No.: US 11,133,348 B2
(45) Date of Patent: Sep. 28, 2021

(54) SENSOR PACKAGE STRUCTURE AND SENSING MODULE THEREOF

(71) Applicant: KINGPAK TECHNOLOGY INC., Hsin-Chu County (TW)

(72) Inventors: Li-Chun Hung, Hsin-Chu County (TW); Chien-Chen Lee, Hsin-Chu County (TW); Jian-Ru Chen, Hsin-Chu County (TW); Chen-Pin Peng, Hsin-Chu County (TW)

(73) Assignee: KINGPAK TECHNOLOGY INC., Hsin-Chu County (TW)

( * ) Notice: Subject to any disclaimer, the term of this patent is extended or adjusted under 35 U.S.C. 154(b) by 9 days.

(21) Appl. No.: 16/744,845

(22) Filed: Jan. 16, 2020

(65) Prior Publication Data

US 2020/0350357 A1 Nov. 5, 2020

Related U.S. Application Data

(60) Provisional application No. 62/840,472, filed on Apr. 30, 2019.

(51) Int. Cl.
*H01L 27/146* (2006.01)
*H01L 23/00* (2006.01)

(52) U.S. Cl.
CPC ........ *H01L 27/14683* (2013.01); *H01L 24/26* (2013.01); *H01L 27/14618* (2013.01); *H01L 2224/48227* (2013.01)

(58) Field of Classification Search
CPC . H01L 21/8238–823892; H01L 27/092–0928; H01L 27/11807; H01L 2027/11809–11894; H01L 2224/48227; H01L 24/26; H01L 27/14618; H01L 27/14683; H01L 24/48; H01L 2224/04042; H01L 2224/32014; H01L 2224/29011; H01L 2224/29035; H01L 2224/73265; H01L 2224/73215; H01L 2224/33181; H01L 2224/32225; H01L 27/14623;
(Continued)

(56) References Cited

U.S. PATENT DOCUMENTS 8,575,634 B2 11/2013 Liu et al.
9,905,597 B2 2/2018 Yang et al.
(Continued)

FOREIGN PATENT DOCUMENTS

TW 201813069 A 4/2018

*Primary Examiner* — Jonathan Han
(74) *Attorney, Agent, or Firm* — Li & Cai Intellectual Property (USA) Office

(57) ABSTRACT

A sensor package structure and a sensing module thereof are provided. The sensor package structure includes a substrate, a sensor chip disposed on the substrate, a light-curing layer disposed on the sensor chip, a light-permeable layer arranged above the sensor chip through the light-curing layer, and a shielding layer disposed on a surface of the light-permeable layer. The light-curing layer has an inner lateral side and an outer lateral side opposite to the inner lateral side, and the inner lateral side is separated from the outer lateral side by a first distance. In a transverse direction parallel to a top surface of the sensor chip, the outer lateral side is separated from an outer lateral edge by a second distance which is within a range of ½ to ⅓ of the first distance.

10 Claims, 5 Drawing Sheets

(58) Field of Classification Search
CPC ......... H01L 27/1462; B81C 2203/0714; B81C 2203/0728; B81C 2203/0735; B81C 2203/0742
See application file for complete search history.

(56) References Cited

U.S. PATENT DOCUMENTS

| | | | |
|---|---|---|---|
| 2011/0156074 A1* | 6/2011 | Liu | H01L 31/0203 257/98 |
| 2012/0056292 A1* | 3/2012 | Suzuki | H01L 27/14687 257/432 |
| 2012/0211852 A1* | 8/2012 | Iwafuchi | H01L 27/14623 257/435 |
| 2013/0028589 A1* | 1/2013 | Ng | H01L 27/14618 396/529 |
| 2013/0286566 A1* | 10/2013 | Tsuduki | H05K 5/0091 361/679.01 |
| 2018/0012919 A1* | 1/2018 | Tu | H01L 27/14618 |
| 2018/0019274 A1* | 1/2018 | Yang | H01L 27/14618 |

* cited by examiner

SENSOR PACKAGE STRUCTURE AND SENSING MODULE THEREOF

CROSS-REFERENCE TO RELATED PATENT APPLICATION

This application claims the benefit of priority to U.S. Provisional Patent Application Ser. No. 62/840,472 filed Apr. 30, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a sensor package structure and a sensing module thereof.

BACKGROUND OF THE DISCLOSURE

In a conventional sensor package structure, a glass board is disposed above a sensor chip through an adhesive, and the adhesive is arranged around a sensing region of the sensor chip. However, light passing through the glass board may be partially reflected by the adhesive, so that the sensing region of the sensor chip may be affected by the reflected light (e.g., a flare phenomenon).

SUMMARY OF THE DISCLOSURE

In response to the above-referenced technical inadequacies, the present disclosure provides a sensor package structure and a sensing module thereof to effectively improve the flare phenomenon issue of the conventional sensor package structure.

In one aspect, the present disclosure provides a sensor package structure, which includes a substrate, a sensor chip, a light-curing layer, a light-permeable layer, and a shielding layer. The sensor chip disposed on the substrate, wherein a top surface of the sensor chip includes a sensing region and a carrying region arranged around the sensing region. The light-curing layer has an annular shape and is disposed on the carrying region. The light-curing layer has an inner lateral side and an outer lateral side opposite to the inner lateral side, and the inner lateral side is separated from the outer lateral side by a first distance. The light-permeable layer is arranged above the sensor chip through the light-curing layer. The light-permeable layer, the light-curing layer, and the sensor chip jointly surround an enclosed space, and the sensing region faces toward the light-permeable layer. The shielding layer is disposed on a surface of the light-permeable layer and has an outer lateral edge. In a transverse direction parallel to the top surface of the sensor chip, the outer lateral side of the light-curing layer is separated from the outer lateral edge of the shielding layer by a second distance which is within a range of ½ to ⅓ of the first distance.

In one aspect, the present disclosure provides a sensing module of a sensor package structure, which includes a sensor chip, a light-curing layer, a light-permeable layer, and a shielding layer. The sensor chip has a top surface that includes a sensing region and a carrying region arranged around the sensing region. The light-curing layer has an annular shape and is disposed on the carrying region. The light-curing layer has an inner lateral side and an outer lateral side opposite to the inner lateral side, and the inner lateral side is separated from the outer lateral side by a first distance. The light-permeable layer is arranged above the sensor chip through the light-curing layer. The light-permeable layer, the light-curing layer, and the sensor chip jointly surround an enclosed space, and the sensing region faces toward the light-permeable layer. The shielding layer is disposed on a surface of the light-permeable layer and has an outer lateral edge. In a transverse direction parallel to the top surface of the sensor chip, the inner lateral side of the light-curing layer is separated from the outer lateral edge of the shielding layer by an overlapping distance, and the overlapping distance is within a range of ½ to ⅔ of the first distance.

In one aspect, the present disclosure provides a sensing module of a sensor package structure, which includes a sensor chip, a light-curing layer, a light-permeable layer, and a shielding layer. The sensor chip has a top surface that includes a sensing region and a carrying region arranged around the sensing region. The light-curing layer has an annular shape and is disposed on the carrying region. The light-curing layer has an inner lateral side and an outer lateral side opposite to the inner lateral side, and the inner lateral side is separated from the outer lateral side by a first distance. The light-permeable layer is arranged above the sensor chip through the light-curing layer. The light-permeable layer, the light-curing layer, and the sensor chip jointly surround an enclosed space. The light-permeable layer has a first surface, a second surface opposite to the first surface, and an outer lateral surface that is connected to the first surface and the second surface, and the second surface faces toward the sensing region. The shielding layer is disposed on the light-permeable layer and has an outer lateral edge. In a transverse direction parallel to the top surface of the sensor chip, the outer lateral surface of the light-permeable layer is separated from the outer lateral edge of the shielding layer by a second distance, and the second distance is within a range of ½ to ⅓ of the first distance.

Therefore, within the sensor package structure and the sensing module in the present disclosure, the shielding layer is formed at a specific position (such as above the second distance or the overlapping distance), so the flare phenomenon caused by light reflected from the light-curing layer can be effectively mitigated. Meanwhile, a portion of the light-curing layer under the shielding layer can be irradiated by enough curing-light (e.g., ultraviolet light) such that the light-curing layer is entirely solidified.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
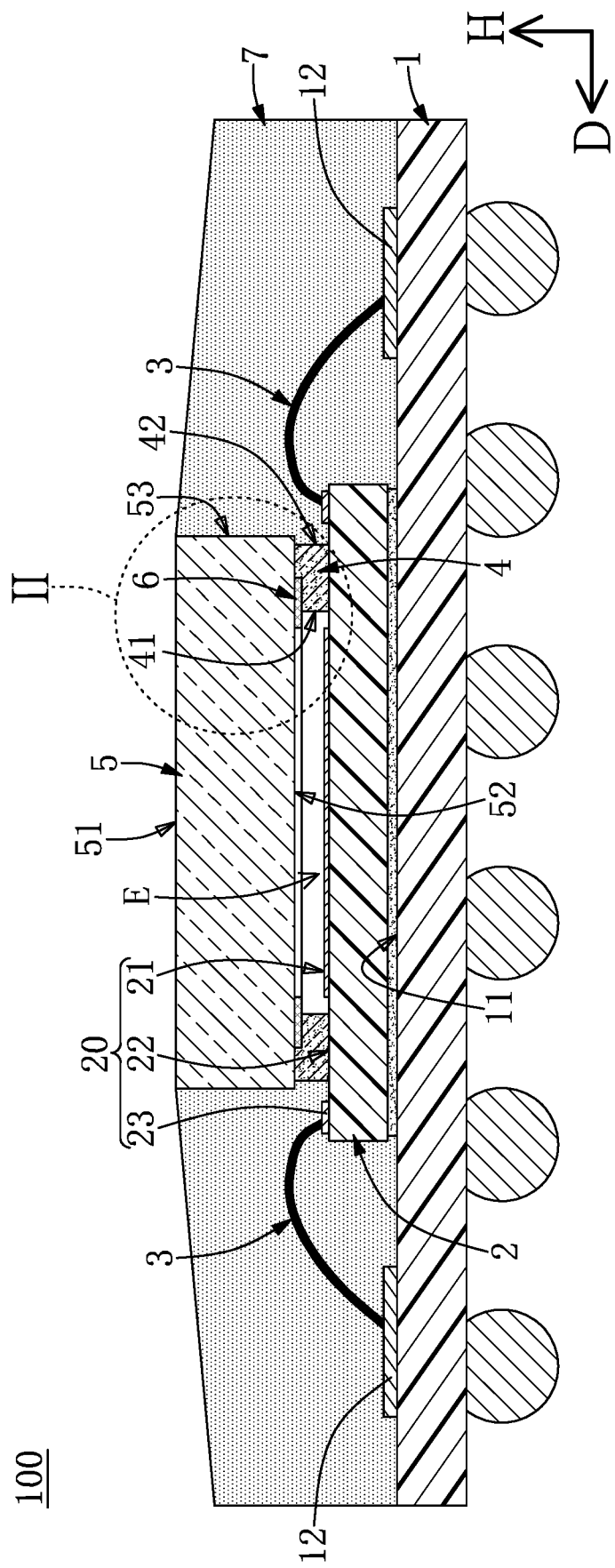
FIG. 1 is a cross-sectional view of a sensor package structure according to a first embodiment of the present disclosure.

Please refer to FIG. 1 to FIG. 4 where embodiments of the disclosure are illustrated. Please note that the quantity and appearance mentioned in the drawings corresponding to the embodiments are simply used to specifically recite implementation of the disclosure, for better understanding the content of the disclosure, not for limiting the scope of the disclosure.

First Embodiment

Figure 2:
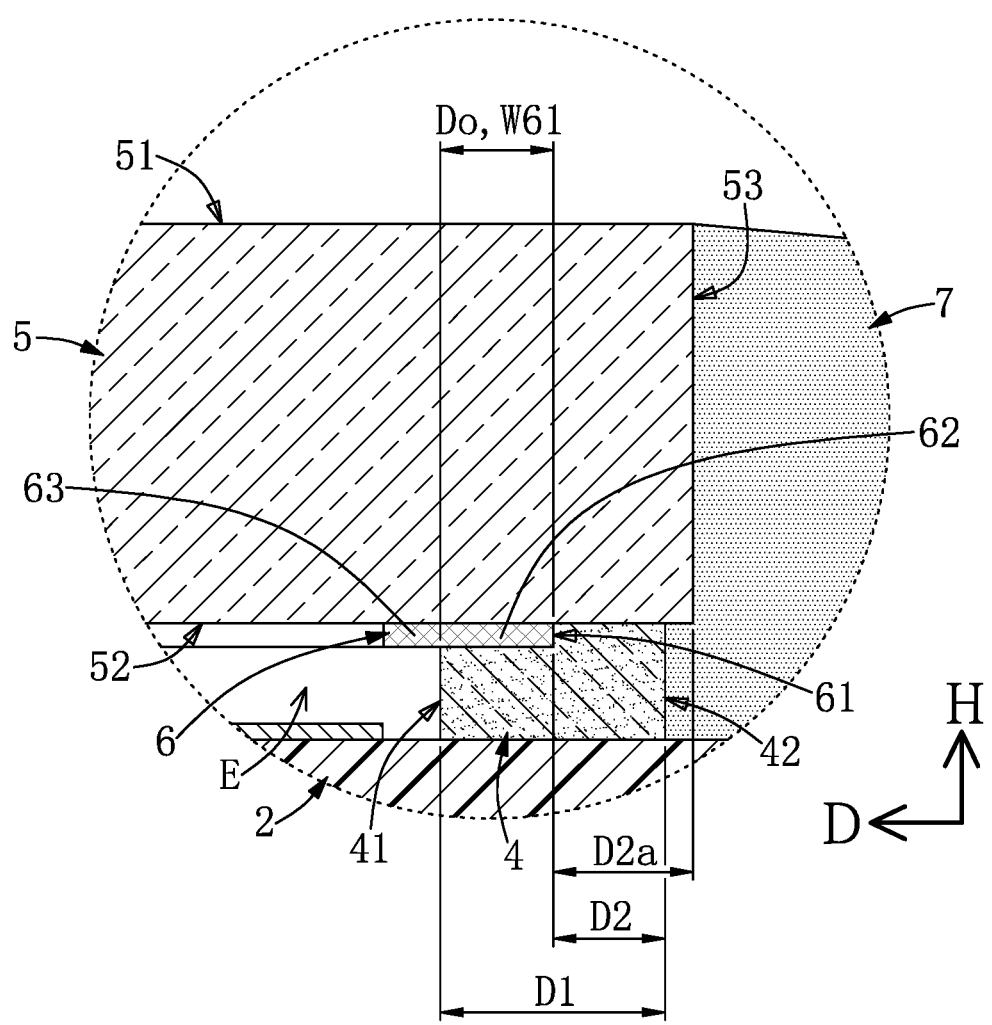
FIG. 2 is an enlarged view of portion II of FIG. 1.
Figure 3:
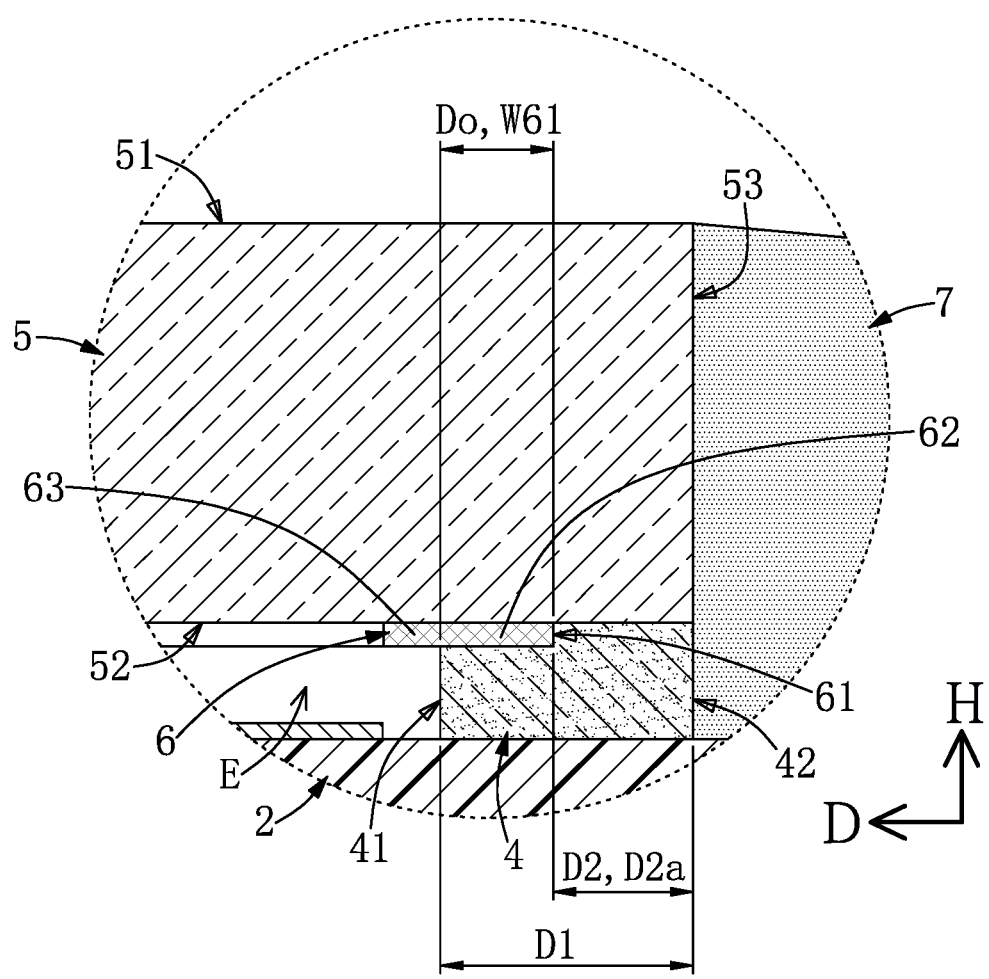
FIG. 3 is an enlarged view showing a different configuration of portion II of FIG. 2.

Referring to FIG. 1 to FIG. 3, a first embodiment of the present disclosure provides a sensor package structure 100. In other words, any package structure not encapsulating a sensor chip therein has a structural design different from that of the sensor package structure 100 of the present embodiment. These two kinds of structures are not comparable.

As shown in FIG. 1 and FIG. 2, the sensor package structure 100 includes a substrate 1, a sensor chip 2 disposed on the substrate 1, a plurality of metal wires 3 electrically coupled to the sensor chip 2 and the substrate 1, a light-curing layer 4 disposed on the sensor chip 2, a light-permeable layer 5 arranged above the sensor chip 2 through the light-curing layer 4, a shielding layer 6 disposed on a surface of the light-permeable layer 5, and a package body 7 formed on the substrate 1.

Although the sensor package structure 100 in the present embodiment includes the above components, but the sensor package structure 100 can be adjusted or modified according to design requirements. For example, in other embodiments not drawn in the present disclosure, the sensor package structure 100 can be provided without the metal wires 3, and the sensor chip 2 is fixed onto the substrate 1 in a flip-chip manner. Moreover, in the present embodiment, the sensor chip 2, the light-curing layer 4, the light-permeable layer 5, and the shielding layer 6 can be jointly defined as a sensing module. The sensing module can be independently used or can be used in cooperation with components other than those of the present embodiment.

It should be noted that the drawings of the present embodiment are cross-sectional views in order to more easily describe the sensor package structure 100 of the present embodiment, and portions of the sensor package structure 100 not shown in the drawings shall have corresponding structures. For example, FIG. 1 shows only two of the metal wires 3, but portions of the sensor package structure 100 not shown in FIG. 1 include other metal wires 3. The structure and connection relationship of each component of the sensor package structure 100 will be recited in the following description.

The substrate 1 of the present embodiment is a square or rectangular printed circuit board (PCB), but the present disclosure is not limited thereto. An upper surface of the substrate 1 includes a chip-bonding region 11 arranged approximately on a center portion thereof, and the substrate 1 includes a plurality of first soldering pads 12 that are disposed on the upper surface and outside of the chip-bonding region 11 (or the sensor chip 2). The first soldering pads 12 in the present embodiment are roughly arranged in a ring, but the present disclosure is not limited thereto. For example, in other embodiments not shown in the drawings of the present disclosure, the first soldering pads 12 can be arranged in two rows respectively at two opposite sides of the chip-bonding region 11.

In addition, the substrate 1 can be further provided with a plurality of solder balls (not labeled) disposed on a lower surface thereof. The substrate 1 can be soldered onto an electronic component (e.g., a PCB) through the solder balls, thereby electrically connecting the sensor package structure 100 to the electronic component.

The sensor chip 2 in the present embodiment is an image sensing chip, but the present disclosure is not limited thereto. The sensor chip 2 is fixed onto the chip-bonding region 11 of the substrate 1. In other words, the sensor chip 2 is arranged inboard of the first soldering pads 12. Moreover, a top surface 20 of the sensor chip 2 has a sensing region 21, a carrying region 22 having an annular shape and around the sensing region 21, and a plurality of second soldering pads 23 arranged outside of the carrying region 22.

Specifically, the number and positions of the second soldering pads 23 of the sensor chip 2 in the present embodiment respectively correspond to those of the first soldering pads 12 of the substrate 1. Terminals at one end of the metal wires 3 are respectively connected to the first soldering pads 12, and terminals at the other end of the metal wires 3 are respectively connected to the second soldering pads 23, so that the substrate 1 and the sensor chip 2 can be electrically connected to each other through the metal wires 3.

The light-curing layer 4 has an annular shape and is disposed on the carrying region 22 of the sensor chip 2. In other words, the light-curing layer 4 in the present embodiment is arranged outside of the sensing region 21 and inboard of the second soldering pads 23, so that a height of the light-curing layer 4 shall not be limited by a height of any one of the metal wires 3, but the present disclosure is not limited thereto. For example, in other embodiments not shown in the drawings of the present disclosure, the light-curing layer 4 can be disposed on the carrying region 22 and covers the second soldering pads 23 and a portion of each of the metal wires 3.

The light-curing layer 4 of the present embodiment is a structure that can be cured by being irradiated with light (e.g., ultraviolet light). Accordingly, any adhesive not cured by being irradiated with light is different from the light-curing layer 4 of the present embodiment. The light-curing layer 4 has an inner lateral side 41 and an outer lateral side 42 that is opposite to the inner lateral side 41, and the inner lateral side 41 is separated from the outer lateral side 42 by a first distance D1 along a transverse direction D.

The light-permeable board 5 in the present embodiment is a flat board made by transparent glass, but the present disclosure is not limited thereto. The light-permeable board 5 is disposed on the light-curing layer 4; in other words, the light-curing layer 4 is sandwiched between the light-permeable board 5 and the sensor chip 2. The light-permeable layer 5, the light-curing layer 4, and the sensor chip 2 jointly surround an enclosed space E, and the sensing region 21 is arranged in the enclosed space E and faces toward the light-permeable layer 5.

Moreover, the light-permeable layer 5 in the present embodiment includes a first surface 51, a second surface 52 opposite to the first surface 51, and an outer lateral surface 53 that is connected to the first surface 51 and the second surface 52. The second surface 52 faces toward the sensing region 21, and the outer lateral side 42 of the light-curing layer 4 is retracted a distance from the outer lateral surface 53 of the light-permeable layer 5, but the present disclosure is not limited thereto. For example, as shown in FIG. 3, the outer lateral surface 53 of the light-permeable layer 5 can be flush with the outer lateral side 42 of the light-curing layer 4.

The shielding layer 6 in the present embodiment has an annular shape and is opaque. The shielding layer 6 is disposed on the second surface 52 of the light-permeable layer 5, and is at least partially embedded in the light-curing layer 4. Specifically, a projection region defined by orthogonally projecting the shielding layer 6 onto the top surface 20 of the sensor chip 2 is arranged outside of the sensing region 21, thereby preventing disposition of the shielding layer 6 from affecting a sensing precision of the sensing region 21.

Moreover, the shielding layer 6 has an outer lateral edge 61 embedded in the light-curing layer 4. In the transverse direction D parallel to the top surface 20 of the sensor chip 2, the outer lateral side 42 of the light-curing layer 4 is separated from the outer lateral edge 61 of the shielding layer 6 by a second distance D2. The second distance D2 is within a range of ½ to ⅓ of the first distance D1.

Accordingly, by disposing the shielding layer 6, the flare phenomenon caused by light reflected from the light-curing layer 4 can be effectively reduced, and the light-curing layer 4 under the shielding layer 6 to be irradiated by enough curing-light (e.g., ultraviolet light) such that the light-curing layer 4 is entirely solidified. In other words, the sensor package structure 100 of the present embodiment is provided by forming the shielding layer 6 at a specific position, so the flare phenomenon can be reduced and the light-curing layer 4 can be effectively solidified.

In the above description, the outer lateral side 42 of the light-curing layer 4 and the outer lateral edge 61 of the shielding layer 6 jointly determine the specific position of the shielding layer 6 (i.e., the second distance D2), but the specific position of the shielding layer 6 in the present embodiment can also be determined by other manners. For example, in the transverse direction D parallel to the top surface 20 of the sensor chip 2, the outer lateral surface 53 of the light-permeable layer 5 is separated from the outer lateral edge 61 of the shielding layer 6 by a second distance D2a, and the second distance D2a is within a range of ½ to ⅓ of the first distance D1.

From another point of view, in the transverse direction D parallel to the top surface 20 of the sensor chip 2, the inner lateral side 41 of the light-curing layer 4 overlaps the outer lateral edge 61 of the shielding layer 6 for an overlapping distance Do, and the overlapping distance Do is within a range of ½ to ⅔ of the first distance D1. Specifically, the shielding layer 6 includes an embedded portion 62 and an exposed portion 63. The embedded portion 62 is embedded in the light-curing layer 4, and the exposed portion 63 connects the embedded portion 62 and is arranged in the enclosed space E.

The outer lateral edge 61 of the shielding layer 6 is an edge of the embedded portion 62 distant from the exposed portion 63. The embedded portion 62 has a width W61 (equivalent to the overlapping distance Do) in the transverse direction D. The width W61 is within a range of ½ to ⅔ of the first distance D1. Moreover, a projection region defined by orthogonally projecting the exposed portion 63 onto the top surface 20 of the sensor chip 2 is arranged between the sensing region 21 and the light-curing layer 4, so that the flare phenomenon can be reduced without affecting the sensing precision of the sensing region 21.

The package body 7 is formed on the substrate 1, and covers an outer lateral side of the sensor chip 2, the outer lateral side 42 of the light-curing layer 4, and the outer lateral surface 53 of the light-permeable layer 5. An outer surface of the light-permeable layer 5 is partially exposed from the package body 7. In other words, the sensing module is embedded in the package body 7, and the first surface 51 of the light-permeable layer 5 is exposed from the package body 7. Moreover, the first soldering pads 12, the second soldering pads 23, and the metal wires 3 are entirely embedded in the package body 7, but the present disclosure is not limited thereto.

Furthermore, the package body 7 in the present embodiment is a solidified liquid compound, but the present disclosure is not limited thereto. For example, in other embodiments not shown in the drawings of the present disclosure, the package body 7 can further include a molding compound formed on a top surface of the solidified liquid compound; or the package body 7 can be a molding compound.

Second Embodiment

Figure 4:
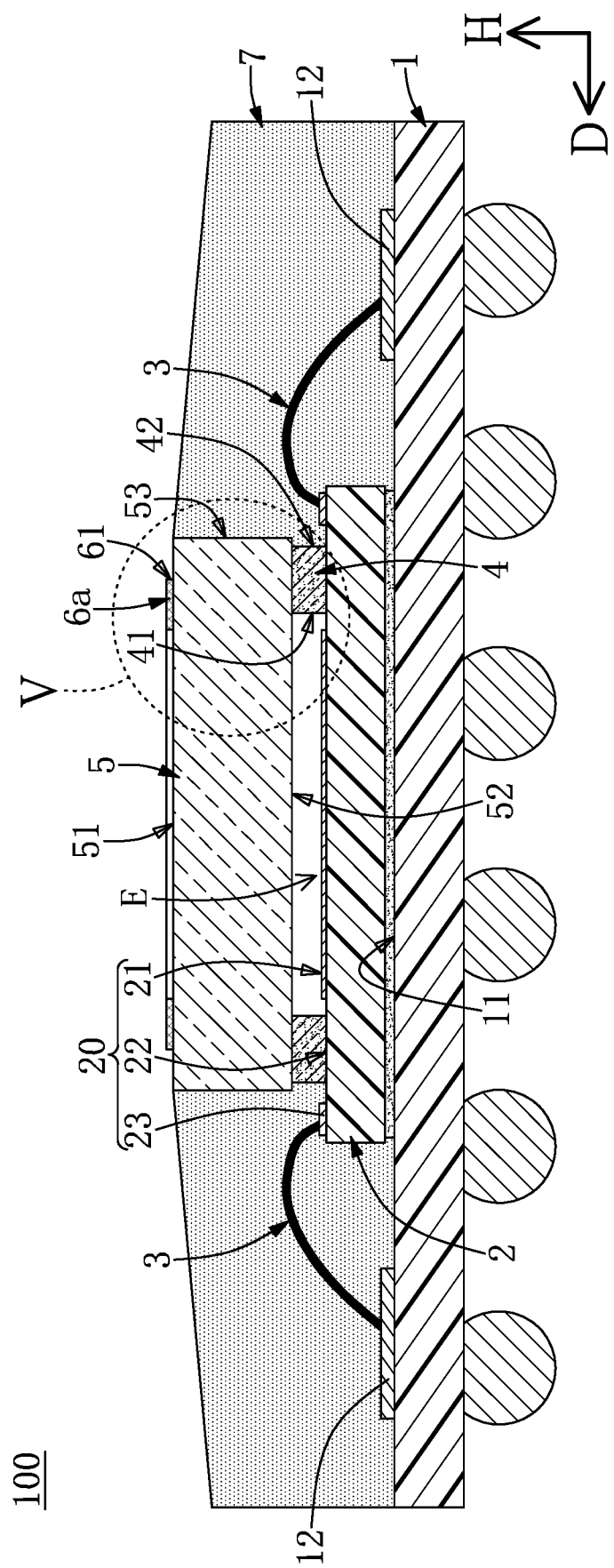
FIG. 4 is a cross-sectional view of a sensor package structure according to a second embodiment of the present disclosure.
Figure 5:
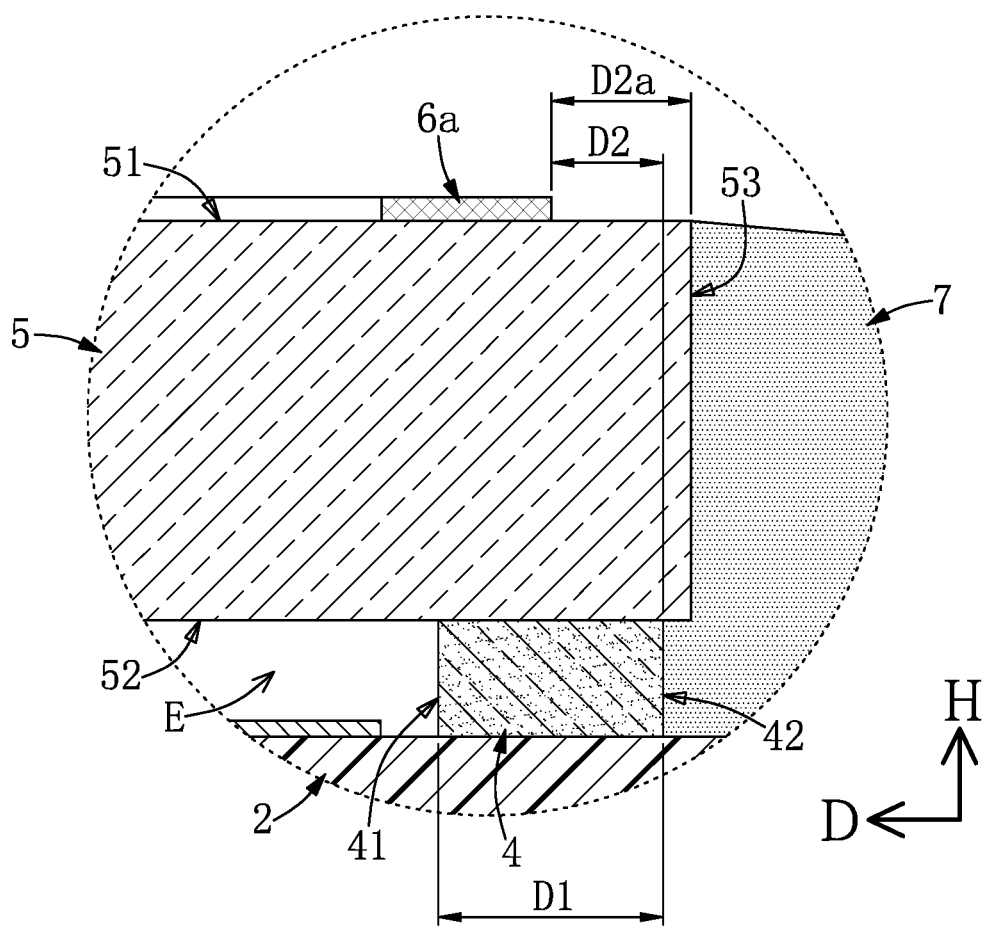
FIG. 5 is an enlarged view of portion V of FIG. 4.

Referring to FIG. 4 and FIG. 5, a second embodiment of the present disclosure is similar to the first embodiment of the present disclosure. Hence, common places between the first and second embodiments (such as, the substrate 1, the sensor chip 2, the metal wires 3, the light-curing layer 4, the light-permeable layer 5, and the package body 7) will not be recited again, and the differences between the first and second embodiments is described in the following context.

In the present embodiment, a shielding layer 6a is not embedded in the light-curing layer 4, and is disposed on the first surface 51 of the light-permeable layer 5. Moreover, a projection region defined by orthogonally projecting the shielding layer 6a onto the top surface 20 of the sensor chip 2 is preferably arranged outside of the sensing region 21.

Specifically, the shielding layer 6a has an outer lateral edge 61 arranged adjacent to the outer lateral surface 53 of the light-permeable layer 5. In a transverse direction D parallel to the top surface 20 of the sensor chip 2, the outer lateral side 42 of the light-curing layer 4 is separated from the outer lateral edge 61 of the shielding layer 6a by a second distance D2. The second distance D2 is within a range of ½ to ⅓ of the first distance D1.

Accordingly, through the arrangement of the shielding layer 6a, the flare phenomenon caused by light reflected from the light-curing layer 4 can be effectively reduced (or improved). Meanwhile, a portion of the light-curing layer 4 shielded by the shielding layer 6a along a direction H (e.g., a height direction) can be irradiated by enough curing-light (e.g., ultraviolet light) such that the light-curing layer 4 is entirely solidified.

In the above description, the outer lateral side 42 of the light-curing layer 4 and the outer lateral edge 61 of the shielding layer 6a jointly determine the specific position of the shielding layer 6a corresponding to the second distance D2, but the specific position of the shielding layer 6a in the present embodiment can also be determined by other manners. For example, in the transverse direction D parallel to the top surface 20 of the sensor chip 2, the outer lateral surface 53 of the light-permeable layer 5 is separated from the outer lateral edge 61 of the shielding layer 6a by a second distance D2a, and the second distance D2a is within a range of ½ to ⅓ of the first distance D1.

In conclusion, within the sensor package structure and the sensing module in the present disclosure, the shielding layer is formed at a specific position (such as the second distance or the overlapping distance), so that the flare phenomenon caused by light reflected from the light-curing layer can be effectively mitigated. Meanwhile, a portion of the light-curing layer under the shielding layer can be irradiated by enough curing-light (e.g., ultraviolet light) such that the light-curing layer is entirely solidified.

In addition, the sensor package structure and the sensing module in the present disclosure can be provided with other structural designs to further reduce the flare phenomenon that is caused by light reflected from the light-curing layer. For example, a projection region defined by orthogonally projecting the exposed portion onto the top surface of the sensor chip is arranged between the sensing region and the light-curing layer.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor package structure, comprising:
a substrate;
a sensor chip disposed on the substrate, wherein a top surface of the sensor chip includes a sensing region and a carrying region arranged around the sensing region;
a light-curing layer having an annular shape, wherein the light-curing layer is directly disposed on and connected to the carrying region, and wherein the light-curing layer has an inner lateral side and an outer lateral side opposite to the inner lateral side, and the inner lateral side is separated from the outer lateral side by a first distance;
a light-permeable layer arranged above the sensor chip through the light-curing layer, wherein the light-permeable layer, the light-curing layer, and the sensor chip jointly surround an enclosed space, and the sensing region faces toward the light-permeable layer; and
a shielding layer having an annular shape, wherein the light shielding layer is disposed on a surface of the light-permeable layer and has an outer lateral edge, and wherein in a transverse direction parallel to the top surface of the sensor chip, the outer lateral side of the light-curing layer is separated from the outer lateral edge of the shielding layer by a second distance, and the second distance is within a range of ½ to ⅓ of the first distance.

2. The sensor package structure according to claim 1, wherein the light-permeable layer includes a first surface and a second surface that is opposite to the first surface, the second surface faces toward the sensing region, and the shielding layer is disposed on the second surface and is at least partially embedded in the light-curing layer.

3. The sensor package structure according to claim 2, wherein the shielding layer includes:
an embedded portion embedded in the light-curing layer and having a width in the transverse direction, wherein the width is within a range of ½ to ⅔ of the first distance; and
an exposed portion arranged in the enclosed space, wherein a projection region defined by orthogonally projecting the exposed portion onto the top surface of the sensor chip is arranged between the sensing region and the light-curing layer.

4. The sensor package structure according to claim 1, wherein the light-permeable layer includes a first surface and a second surface that is opposite to the first surface, the second surface faces toward the sensing region, and the shielding layer is disposed on the first surface.

5. The sensor package structure according to claim 1, wherein a projection region defined by orthogonally projecting the shielding layer onto the top surface of the sensor chip is arranged outside of the sensing region.

6. The sensor package structure according to claim 1, wherein the light-permeable layer includes a first surface, a second surface opposite to the first surface, and an outer lateral surface that is connected to the first surface and the second surface, the second surface facing toward the sensing region, and the outer lateral surface being flush with the outer lateral side of the light-curing layer.

7. The sensor package structure according to claim 1, wherein the light-permeable layer includes a first surface, a second surface opposite to the first surface, and an outer lateral surface that is connected to the first surface and the second surface, the second surface facing toward the sensing region, and the outer lateral side of the light-curing layer being retracted a distance from the outer lateral surface of the light-permeable layer.

8. The sensor package structure according to claim 1, wherein the substrate includes a plurality of first soldering pads arranged outside of the sensor chip, the top surface of the sensor chip includes a plurality of second soldering pads arranged outside of the carrying region, and the sensor package structure further includes:
a plurality of metal wires, wherein terminals at one end of the metal wires are respectively connected to the first soldering pads, and terminals at the other end of the metal wires are respectively connected to the second soldering pads; and
a package body formed on the substrate, wherein the sensor chip, the light-curing layer, the light-permeable layer, and the metal wires are embedded in the package body, and an outer surface of the light-permeable layer is partially exposed from the package body.

9. A sensing module of a sensor package structure, comprising:
a sensor chip having a top surface that includes a sensing region and a carrying region arranged around the sensing region;
a light-curing layer having an annular shape, wherein the light-curing layer is directly disposed on and connected to the carrying region, and wherein the light-curing layer has an inner lateral side and an outer lateral side opposite to the inner lateral side, and the inner lateral side is separated from the outer lateral side by a first distance;
a light-permeable layer arranged above the sensor chip through the light-curing layer, wherein the light-permeable layer, the light-curing layer, and the sensor chip jointly surround an enclosed space, and the sensing region faces toward the light-permeable layer; and a shielding layer having an annular shape, wherein the light shielding layer is disposed on a surface of the light-permeable layer and has an outer lateral edge, and wherein in a transverse direction parallel to the top surface of the sensor chip, the inner lateral side of the light-curing layer overlaps the outer lateral edge of the shielding layer for an overlapping distance, and the overlapping distance is within a range of ½ to ⅔ of the first distance.

10. A sensing module of a sensor package structure, comprising:

a sensor chip having a top surface that includes a sensing region and a carrying region arranged around the sensing region;

a light-curing layer having an annular shape, wherein the light-curing layer is directly disposed on and connected to the carrying region, and wherein the light-curing layer has an inner lateral side and an outer lateral side opposite to the inner lateral side, and the inner lateral side is separated from the outer lateral side by a first distance;

a light-permeable layer arranged above the sensor chip through the light-curing layer, wherein the light-permeable layer, the light-curing layer, and the sensor chip jointly surround an enclosed space, and wherein the light-permeable layer has a first surface, a second surface opposite to the first surface, and an outer lateral surface that is connected to the first surface and the second surface, and the second surface faces toward the sensing region; and a shielding layer having an annular shaper, wherein the light shielding layer is disposed on the light-permeable layer and has an outer lateral edge, and wherein in a transverse direction parallel to the top surface of the sensor chip, the outer lateral surface of the light-permeable layer is separated from the outer lateral edge of the shielding layer by a second distance, and the second distance is within a range of ½ to ⅓ of the first distance.

* * * * *